United States Patent [19]

Seckora

[11] Patent Number: 5,487,023
[45] Date of Patent: Jan. 23, 1996

[54] REPEATABLE FINITE AND INFINITE IMPULSE RESPONSE INTEGRATED CIRCUIT STRUCTURE

[75] Inventor: Michael C. Seckora, Gales Creek, Oreg.

[73] Assignee: Tektronix, Inc., Wilsonville, Oreg.

[21] Appl. No.: 194,963

[22] Filed: Feb. 14, 1994

[51] Int. Cl.⁶ .................................................. G06F 17/10
[52] U.S. Cl. ................................ 364/724.13; 364/724.16; 364/723.17
[58] Field of Search ........................ 364/724.13, 724.16, 364/724.17, 724.01

[56] References Cited

U.S. PATENT DOCUMENTS

| | | | |
|---|---|---|---|
| 4,766,561 | 8/1988 | Thompson et al. | 364/724.13 |
| 4,802,111 | 1/1989 | Barkan et al. | 364/724.13 |
| 5,262,972 | 11/1993 | Holder et al. | 364/724.13 |
| 5,319,584 | 6/1994 | Ooyabu | 364/724.01 |
| 5,339,264 | 8/1994 | Said et al. | 364/724.16 |

OTHER PUBLICATIONS

"Discrete–Time Signal Processing", Sections 6.3–6.6 (pp. 300–323), Alan V. Oppenheim and Ronald W. Schafer, 1989 Prentice Hall, Englewood Cliffs, New Jersey.

Primary Examiner—David H. Malzahn
Attorney, Agent, or Firm—Francis I. Gray; John Smith-Hill; John D. Winkelman

[57] ABSTRACT

A repeatable finite anti infinite impulse response integrated circuit structure has a plurality of filter units programmably interconnected, with each filter unit having a pair of repeatable cells. Each cell has a coefficient stage for receiving a filter coefficient, a mixer stage for multiplying a selected one of a plurality of input signals by the filter coefficient, an accumulator stage for selectively delaying an input accumulation signal, and a summation stage for adding the input accumulation signal to the weighted signal to produce an output accumulation signal. With appropriate programming many desired finite/infinite impulse response filter configurations may be achieved.

23 Claims, 15 Drawing Sheets

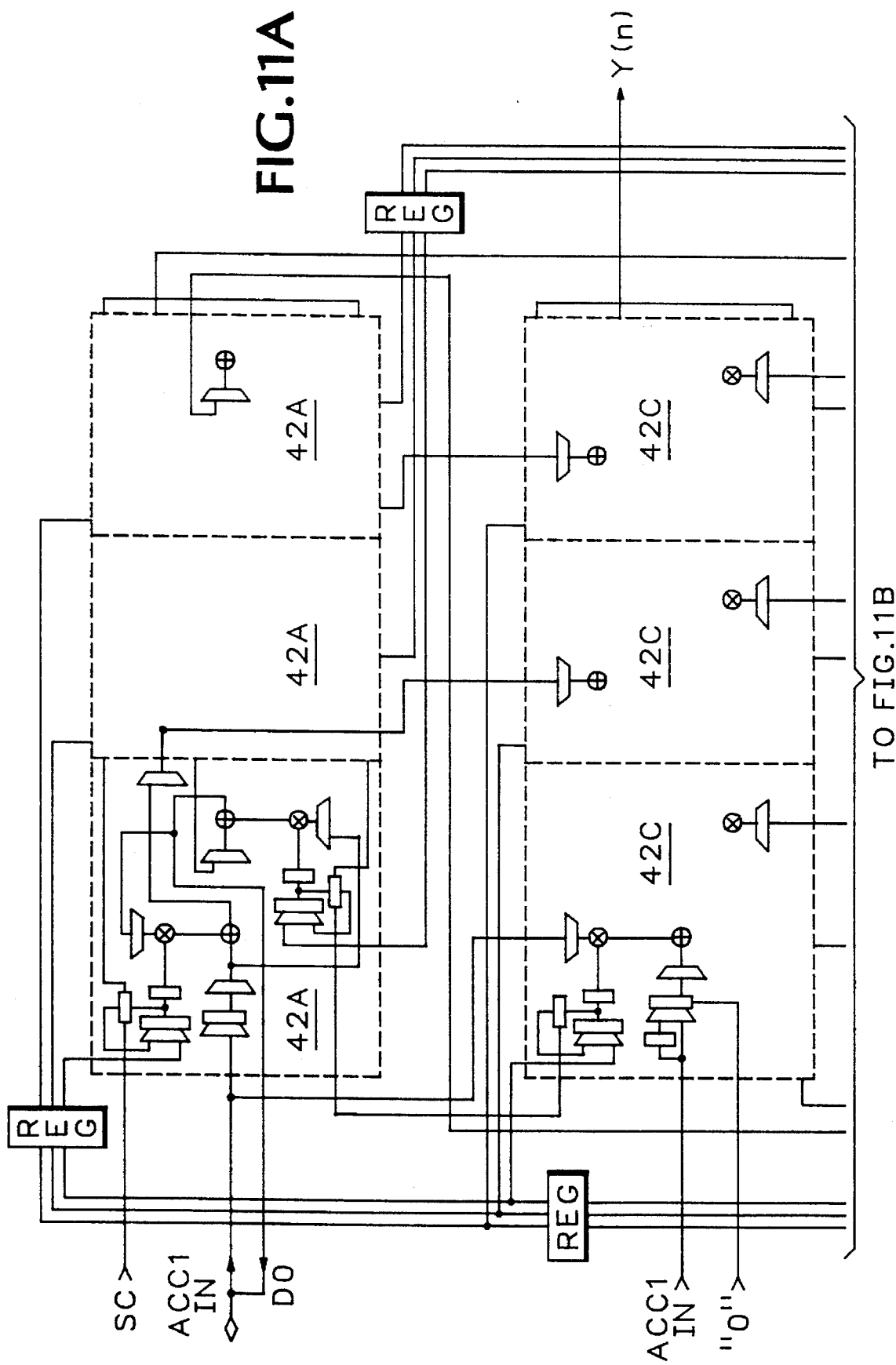

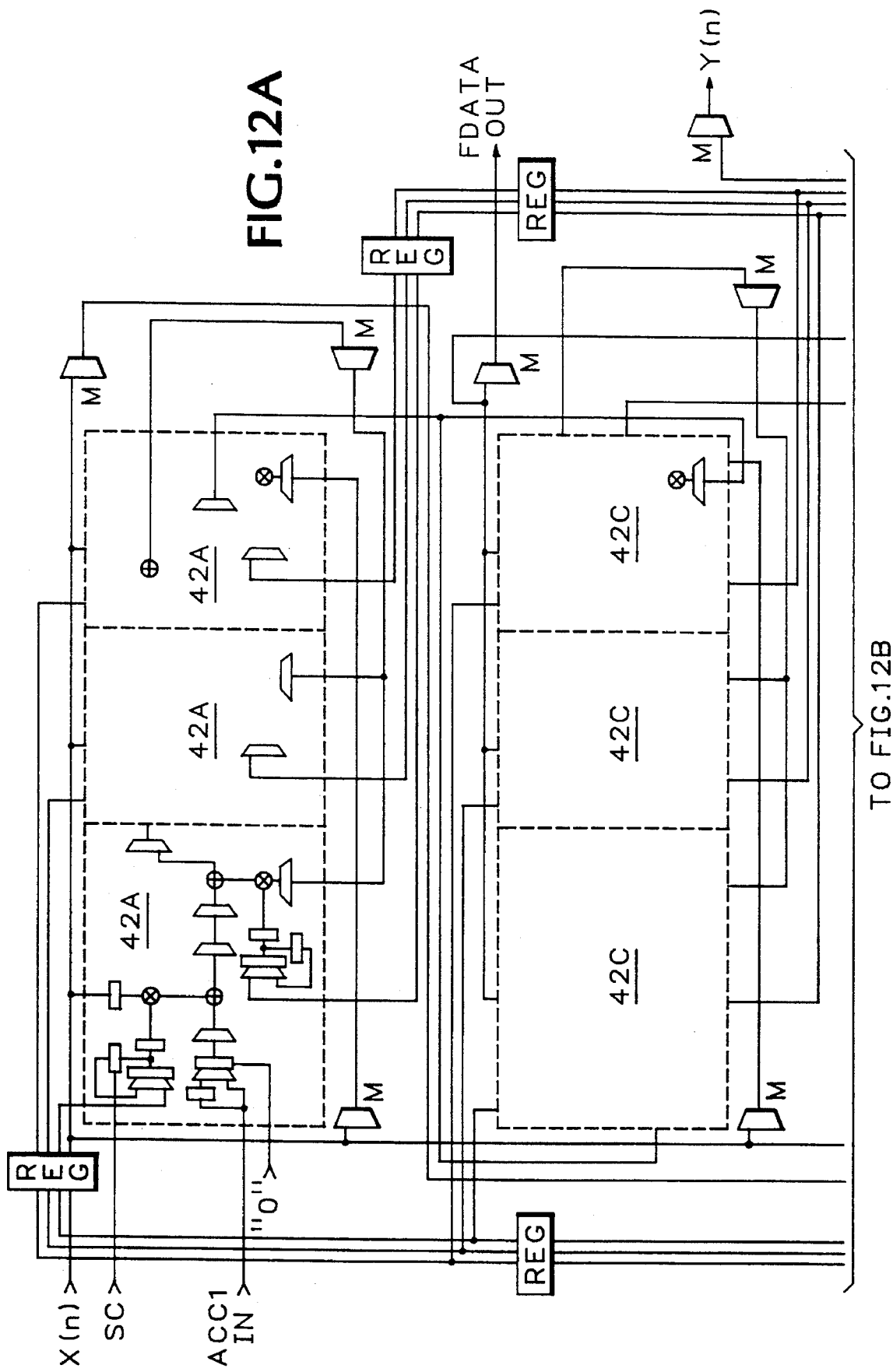

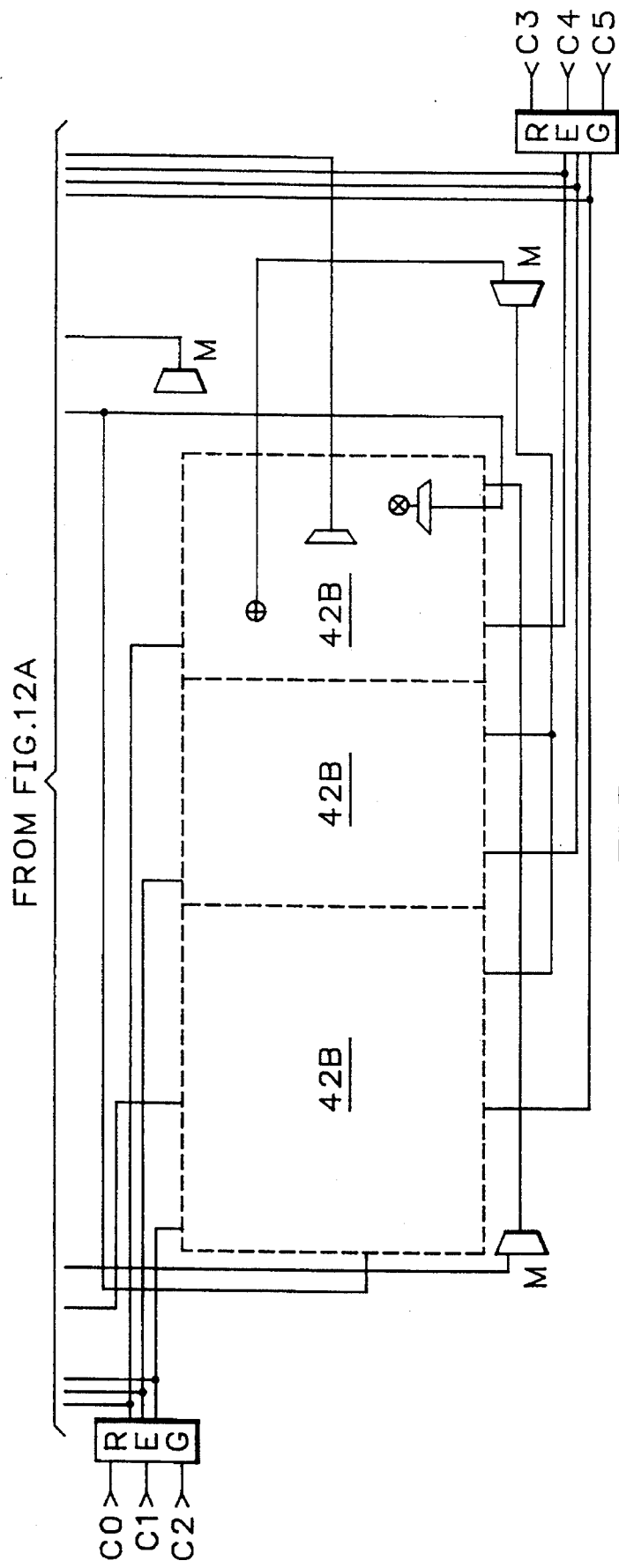

REPEATABLE FINITE AND INFINITE IMPULSE RESPONSE INTEGRATED CIRCUIT STRUCTURE

BACKGROUND OF THE INVENTION

The present invention relates to digital filters, and more particularly to a repeatable finite and infinite impulse response integrated circuit (IC) structure having a plurality of standard cells repeated on an IC substrate and interconnected, the cells being programmable to provide most desired FIR or IIR filter configurations.

Finite impulse response (FIR) and infinite impulse response (IIR) filters generally are individually designed for each application. This requires a specially designed integrated circuit structure for each desired FIR or IIR filter. Various types of FIR and IIR filter designs are shown in the text book "Discrete-Time Signal Processing" by Oppenheim and Schafer, published 1989 by Prentice Hall of Englewood Cliffs, N.J., at sections 6.3–6.6 (pages 300–323), incorporated herein by reference.

What is desired is a standard integrated circuit structure that may be programmed to become a desired FIR or IIR filter configuration.

SUMMARY OF THE INVENTION

Accordingly the present invention provides a repeatable finite and infinite impulse response integrated circuit (IC) structure using a plurality of repeatable cells coupled together, the cells being programmable according to the desired finite impulse response (FIR) or infinite impulse response (IIR) filter configuration desired. Each cell has a coefficient stage for receiving a filter coefficient, a mixer stage for multiplying a selected one of a plurality of input signals by the filter coefficient to produce a weighted signal, an accumulator, delay stage for selectively delaying an input accumulation signal, and a summation stage for adding the input accumulation signal from the accumulator delay stage to the weighted signal to produce an output accumulation signal. Pairs of the cells are interconnected for form filter units, and a plurality of filter units are programmably interconnected to form a programmable finite/infinite impulse response filter structure that may be programmed to be any desired finite/infinite impulse response filter configuration.

The objects, advantages and other novel features of the present invention are apparent from the following detailed description when read in light of the appended claims and attached drawing.

BRIEF DESCRIPTION OF THE DRAWING

FIG. 12 is a block diagram view of a parallel form structure for a sixth-order filter system with transposed real and complex poles grouped in pairs.

DESCRIPTION OF THE PREFERRED EMBODIMENT

Figure 1:
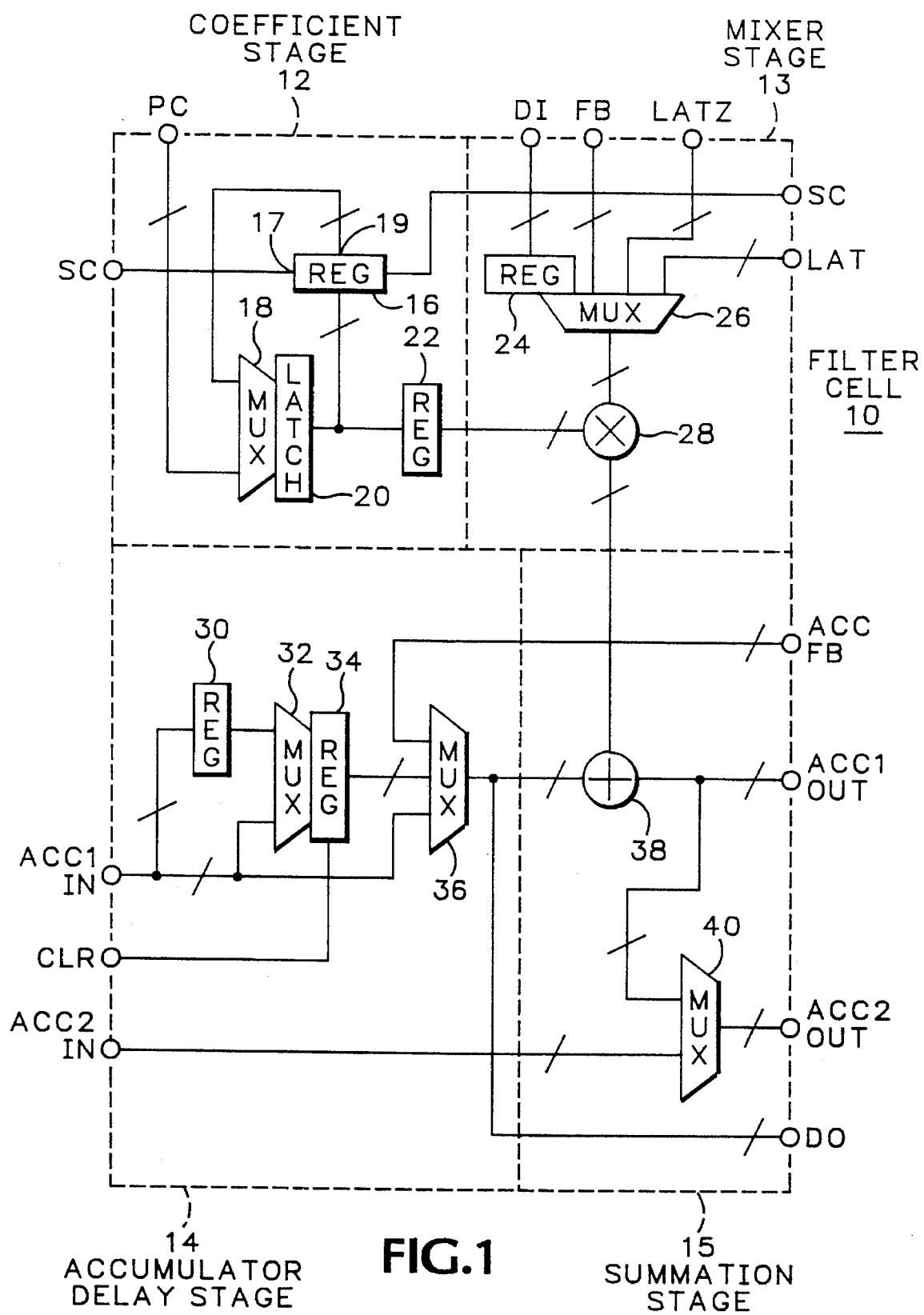
FIG. 1 is a block diagram view of a repeatable cell according to the present invention.

Referring now to FIG. 1 a repeatable cell 10 for use in a repeatable finite and infinite impulse response integrated circuit (IC) structure is shown. The repeatable cell 10 has a coefficient stage 12, a mixer stage 13, an accumulator delay stage 14 and a summation stage 15. The coefficient stage 12 has an input coefficient register 16 that has a serial input 17 by which a serial coefficient SC may be loaded. The serial coefficient SC may be loaded using boundary scan techniques, as is well known in the art. The input coefficient register 16 has a parallel output 19 that is one input to a coefficient multiplexer 18. The other input to the coefficient multiplexer 18 is a parallel coefficient PC. The output of the coefficient multiplexer 18 is input to a holding register 20, which may be a latch. The output of the holding register is input to an output coefficient register 22. A data register 24 receives data DI from a data bus and provides it as one input to a multiplier multiplexer 26. The multiplier multiplexer 26 has three additional inputs, two for use in a lattice configuration IAT, LATZ and another for use in a feedback FB configuration, as is explained in more detail below. The outputs of the multiplier multiplexer 26 and the output coefficient register 22 are input to a multiplier 28 that provides a weighted data value at its output.

A first accumulator input ACCI_IN is applied to an input accumulator register 30 in the accumulator delay stage 14. The output of the input accumulator register 30 and the first accumulator input ACCI_IN are input to an input accumulator multiplexer 32. The output of the input accumulator multiplexer 32 is input to an output accumulator register 34. The outputs of the output accumulator register 34 and the first accumulator input ACCI_IN are input to a summation input multiplexer 36. Also input to the summation input multiplexer 36 is an accumulated feedback signal ACC_FB used as a lattice accumulator feedback for an all zeros lattice configuration. The output of the summation input multiplexer 36 provides a data output DO for subsequent cells 10 and is input to a summation circuit 38. Also input to the summation circuit 38 is the weighted data value from the multiplier 28. The output of the summation circuit 38 is a first accumulator output ACCI_OUT, and also is input to an output multiplexer 40. The other input to the output multiplexer 40 is a second accumulator input ACC2_IN from a prior cell 10, and the output from the output multiplexer is a second accumulator output ACC2_OUT for input to a subsequent cell 10.

The registers are clocked by a system clock (not shown), and thus act as delay units of one clock interval. In the coefficient stage 12 a serial digital coefficient value SC is clocked into the input coefficient register 16 on consecutive clock pulses. Alternatively the input coefficient register 16 may be loaded in parallel from the latch 20. The latch 20 holds the current coefficient for the output coefficient register 22, while the input coefficient register 16 holds the next coefficient. A parallel digital coefficient value PC may be loaded via the multiplexer 18 into the latch 20 to change the coefficient in the output register 22 rapidly. This provides versatility in the selection and changing of coefficient values.

Likewise the multiplier multiplexer 26, by being able to select one of four inputs for multiplication by the coefficient, provides programmable flexibility. In the accumulator delay stage 14 the arrangement of registers and multiplexers acts as a variable delay device for the first accumulator input ACCI_IN from zero to two clock cycles. A clear command CLR for the output accumulator register 34 provides a means of providing a zero value output from the accumulator delay stage 14. The final programmability for the cell 10 is provided by the output multiplexer 40 that selects either the second accumulator input ACC2_IN or the first accumulator output ACC1_OUT as the second accumulator output ACC2_OUT.

Figure 2:
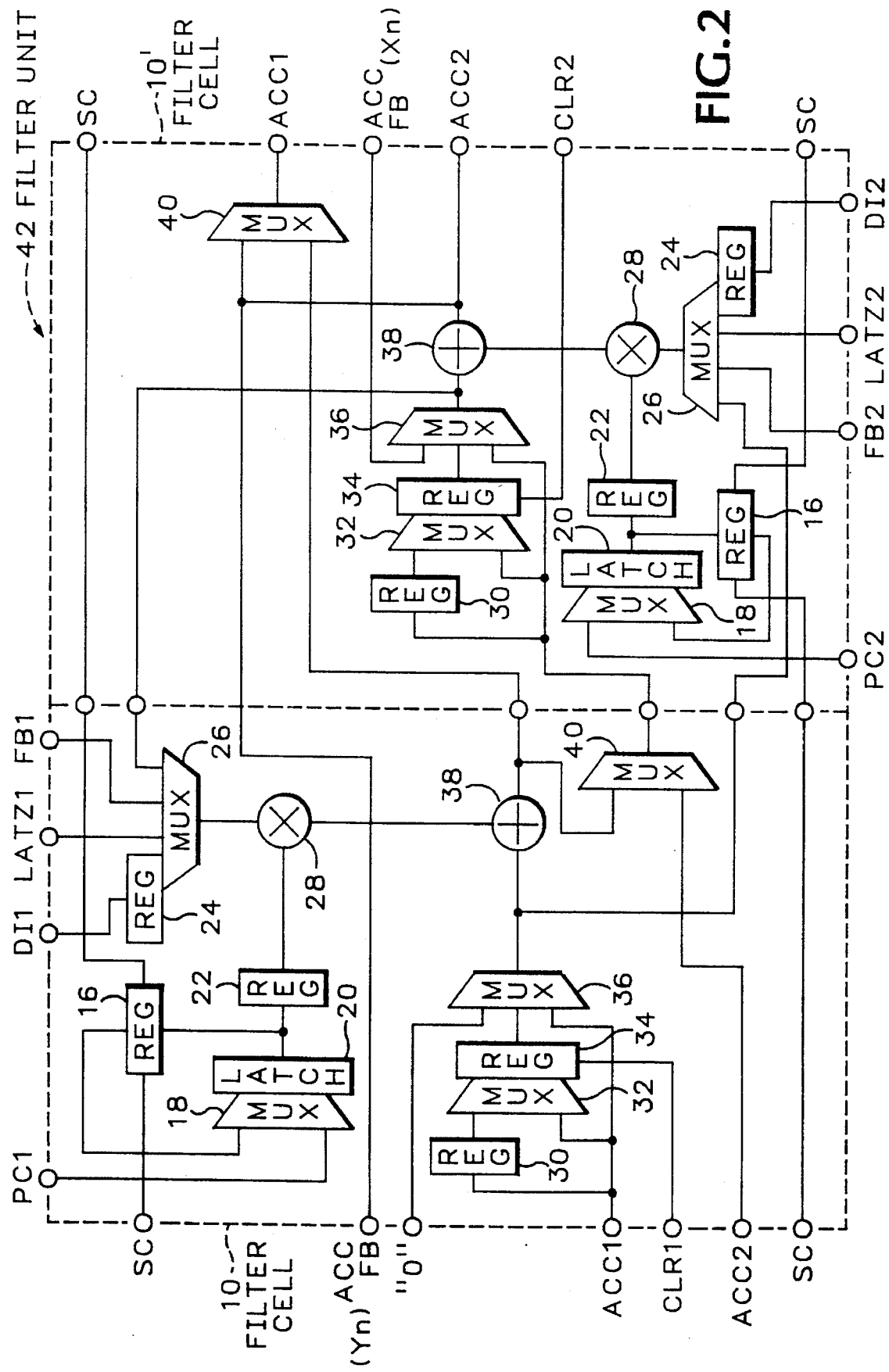
FIG. 2 is a block diagram view of a filter unit according to the present invention.

As shown in FIG. 2 two of the repeatable cells 10 form a filter unit 42, with one repeatable cell 10' being inverted relative to the other. Thus the first accumulator output ACC1-OUT from the summation circuit 38 of the first cell 10 is the second accumulator input ACC2_IN for the second cell 10'. The data output DO from the summation input multiplexer 36 of each cell 10, 10' is input to the lattice input LAT of the multiplier multiplexer 26 of the other cell. The second accumulator output ACC2_OUT of the output multiplexer 40 of the first cell 10 provides the first accumulator input ACCI_IN to the second cell 10'. The summation circuit 38 output from the second cell 10' provides the accumulated lattice ACC_FB input to the summation multiplexer 36 in a prior filter unit 42, and the summation input multiplexer 36 of the second cell receives the accumulated lattice input from a subsequent filter unit. The third input to the summation input multiplexer 36 of the first cell 10 is tied to a zero value. Each cell 10, 10' has its own serial and parallel coefficients SC, PC and output accumulator 34 clear lines CLR.

Figure 3:
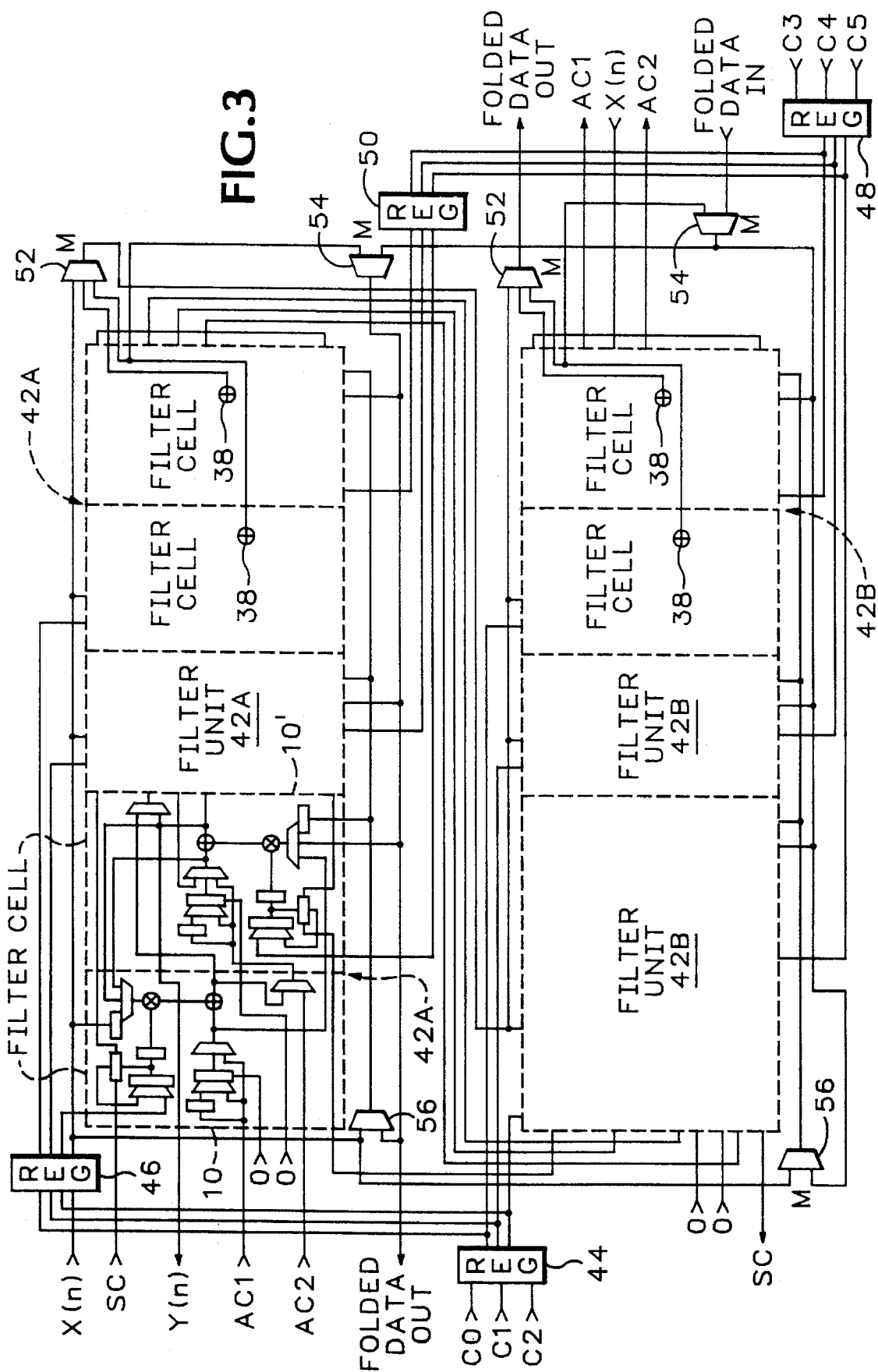
FIG. 3 is a block diagram view of a programmable finite/infinite impulse response filter structure according to the present invention.

FIR and IIR filter structures may be built up using multiples of three filter units 42. A complete repeatable finite and infinite impulse response integrated circuit structure is represented in FIG. 3 using six filter units. A first input coefficient register 44 receives three parallel coefficient values and couples them via an input register 46 to the first cells 10 of the upper three filter units 42A and couples them directly to the first cells of the lower three filter units 42B. Likewise a second input coefficient register 48 receives three other parallel coefficient values and couples them via a third register 50 to the second cells 10' of the upper filter units 42 and directly to the second cells of the lower three filter units. An input data signal X(n) is also provided to the filter units via the input register 46. The serial coefficients SC are loaded into the respective input coefficient registers 16 in series using boundary scan techniques as indicated above. An output multiplexer 52 is provided for each set of three filter units and has as inputs the input signal, which for the second output multiplexer is the output of the first output multiplexer, and the outputs of the summation circuits 38 from the last filter unit 42 in each set of three. The output from the second output multiplexer is a folded data output. An input multiplexer 54 is provided also for each set of three filter units 42, the lower input multiplexer having as inputs a folded data input and the output from the summation circuit 38 from the first cell 10 of the last of the three filter units. The upper input multiplexer 54 has as inputs the output from the lower input multiplexer and the output from the summation circuit 38 from the last of the first cells 10 of the upper three filter units 42A. The outputs of the respective input multiplexers 54 are input to respective intermediate multiplexers 56 and to the respective multiplier multiplexers 26 in the second cells 10'. The other input to the intermediate multiplexers 56 is the input signal X(n), and the outputs of the intermediate multiplexers are coupled to the respective data registers 24 of the second cells. By controlling the selection by the multiplexers, both external and internal to the cells, many filter configurations may be programmed.

Figure 4:
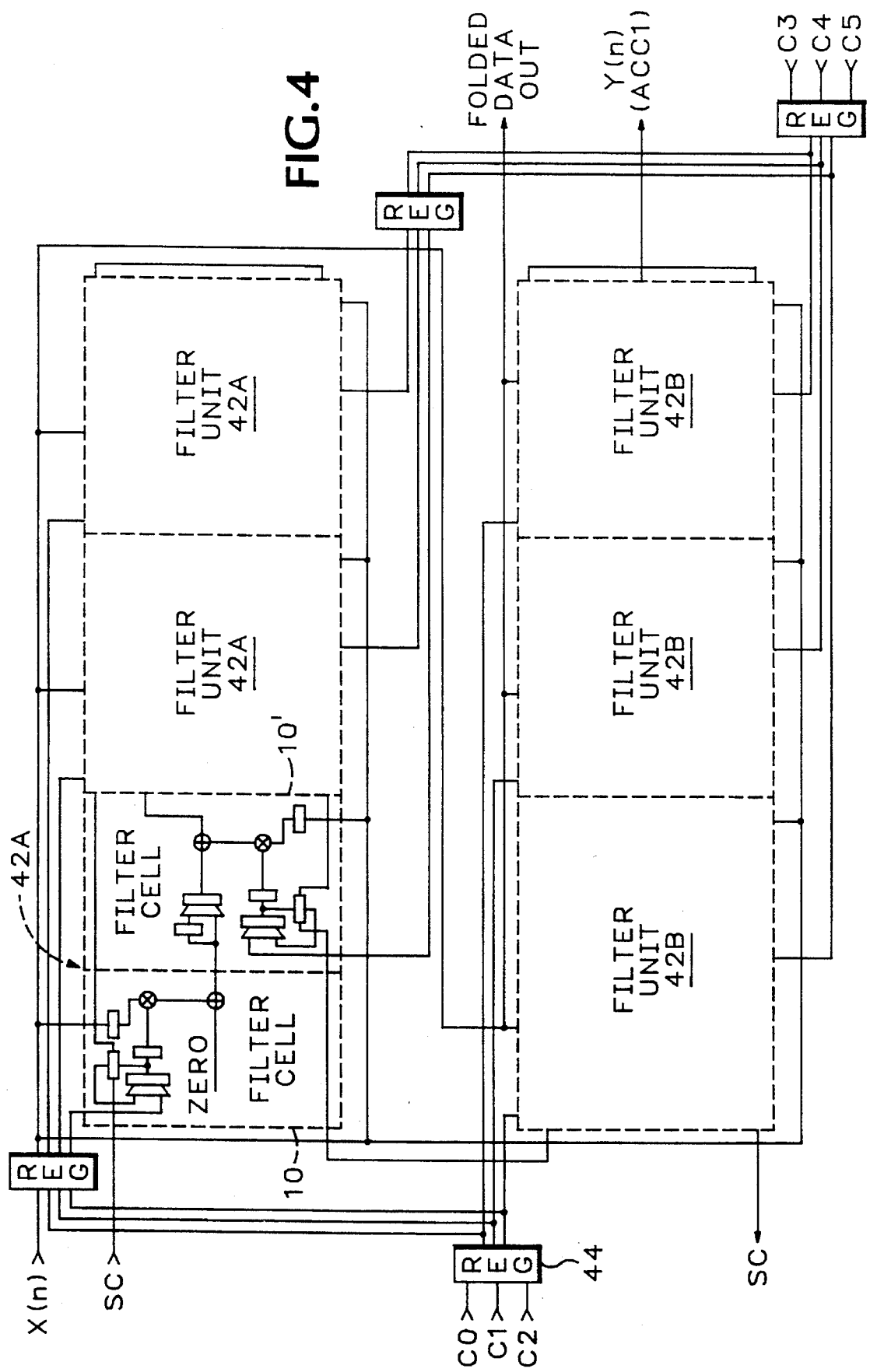
FIG. 4 is a block diagram view of a transposed FIR network structure using the filter units according to the present invention.
Figure 6:
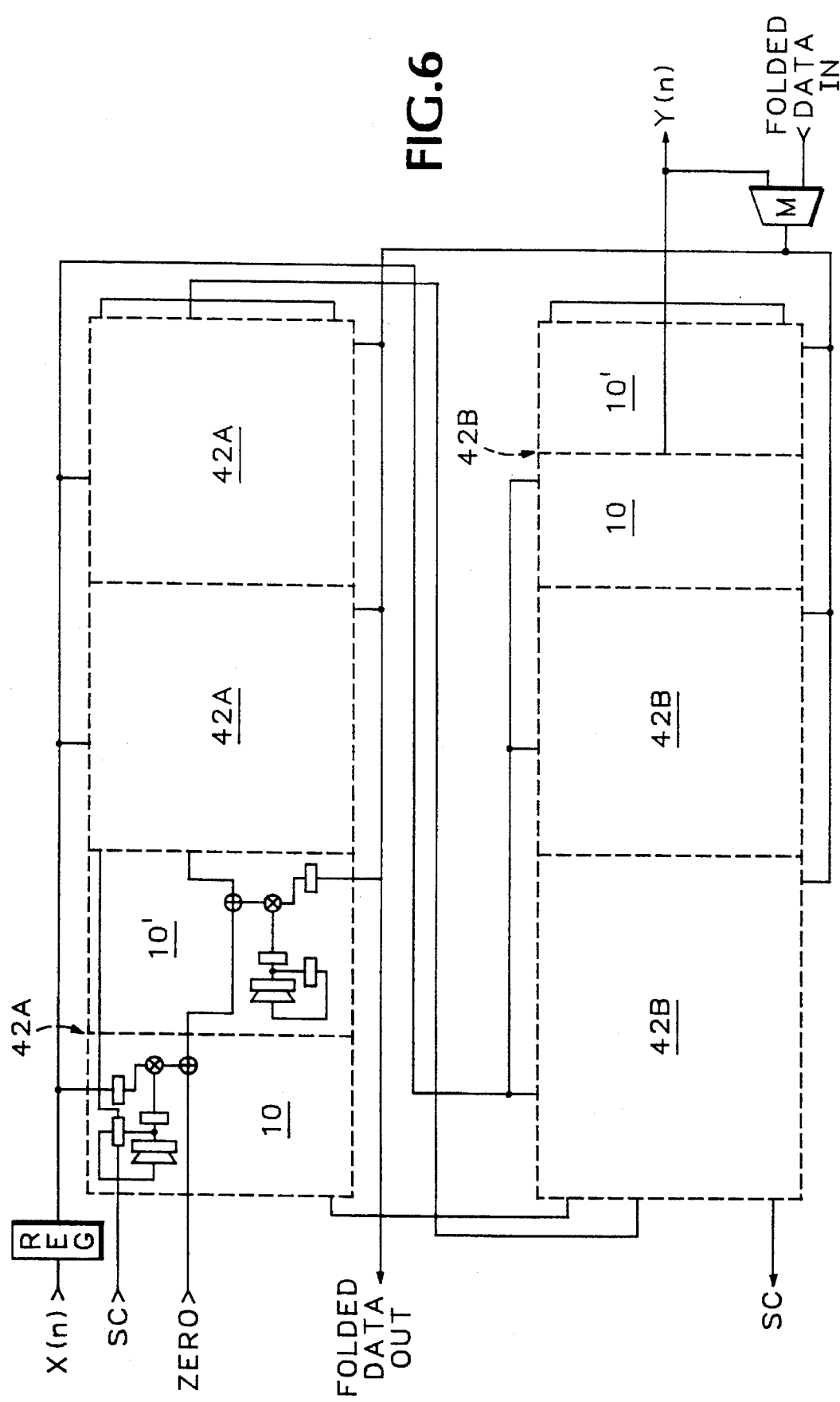
FIG. 6 is a block diagram view of a transposed IIR structure using the filter units according to the present invention.

FIG. 4 shows a transposed FIR structure corresponding to the tapped delay line or transversal filter structure shown as a flow graph in FIG. 6.28 of the aforementioned Oppenheim and Schafer text book. The input signal X(n) is input to the multipliers 28 in each cell 10, 10' via multiplier registers 24. The coefficients are loaded into the output coefficient register 20 either via the serial coefficient registers 16 or directly from a computer as parallel coefficients PC (C0-C5). The initial weighted data in the first cell 10 is added to zero and passed on to the next cell 10' so that after passing through all of the filter units 42 the FIR filtered output signal Y(n) is derived from the ACCI_OUT of the last filter unit. Each filter unit 42 is identical except that the first unit adds zero, i.e., applies the CLR signal to the output accumulator register 34, to the weighted data value rather than a value accumulated from prior units.

Figure 5:
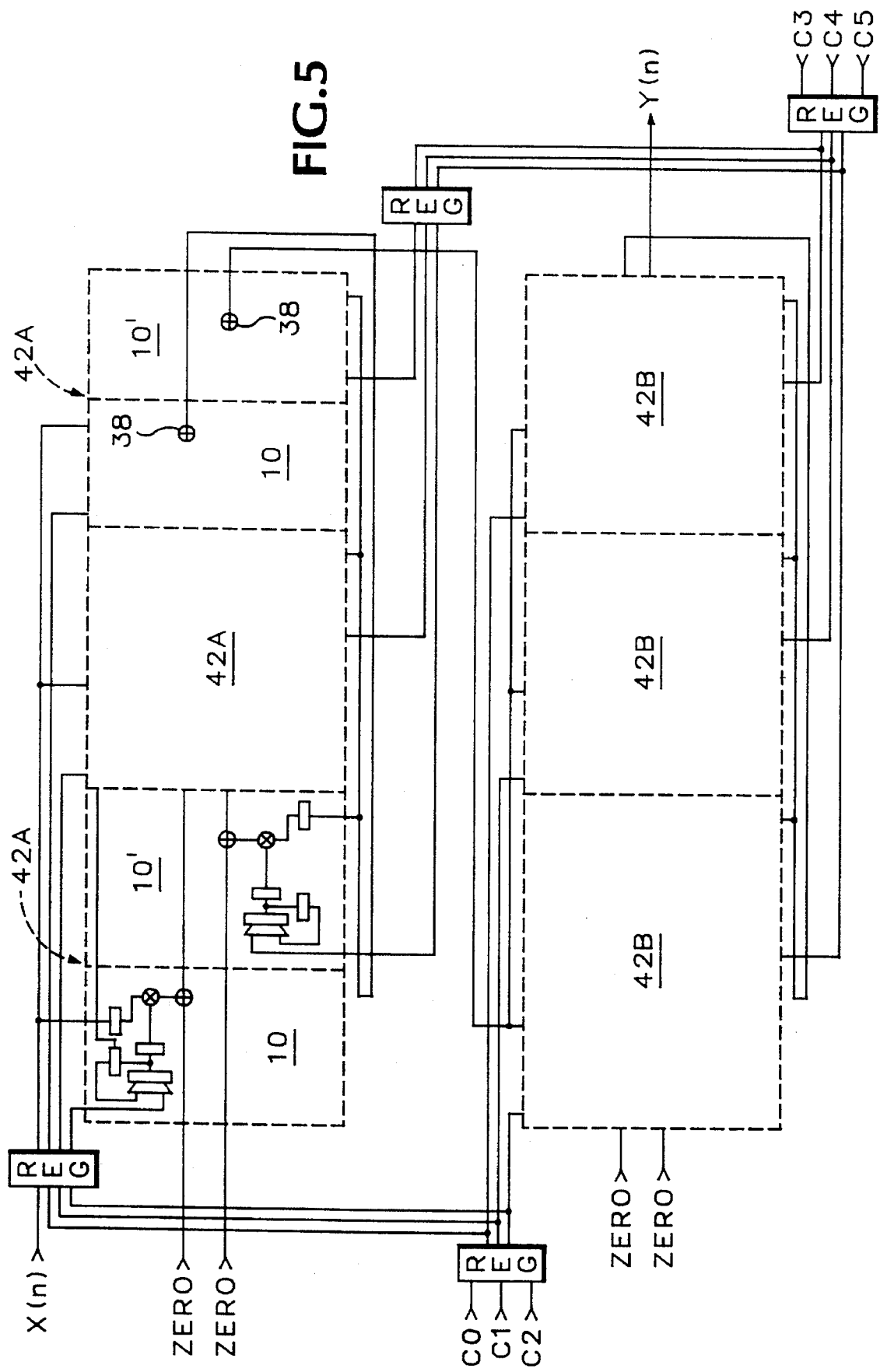
FIG. 5 is a block diagram view of a transposed cascade FIR structure using the filter units according to the present invention.
Figure 7:
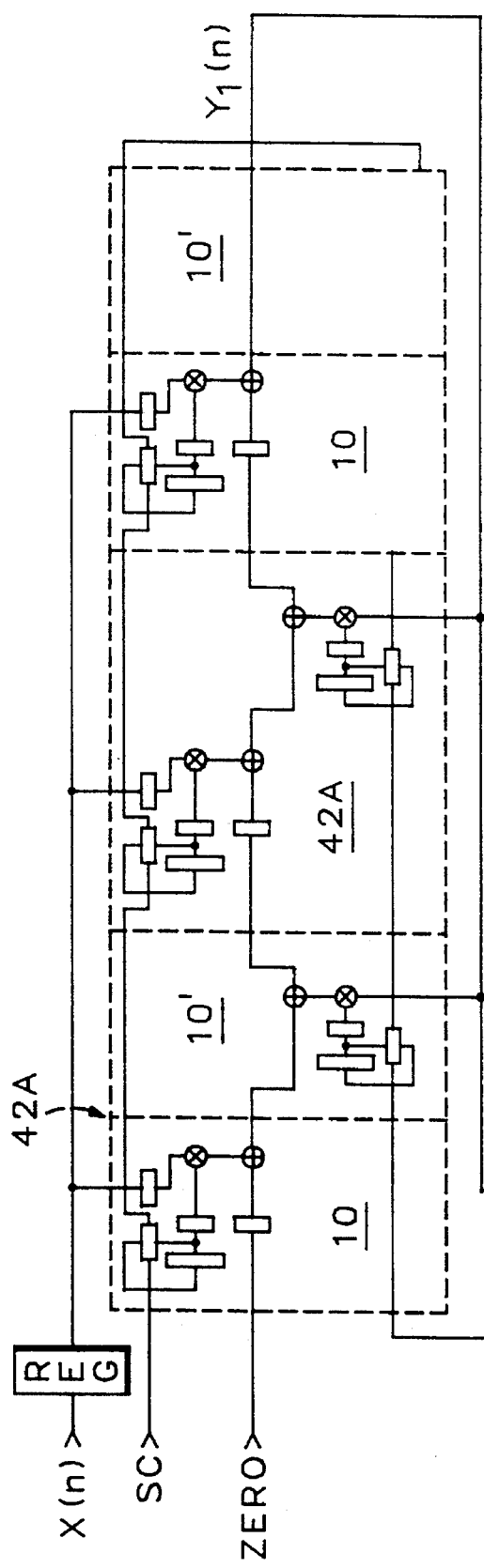
FIG. 7 is a block diagram view of a transposed second-order cascade structure using the filter units according to the present invention.
Figure 7:
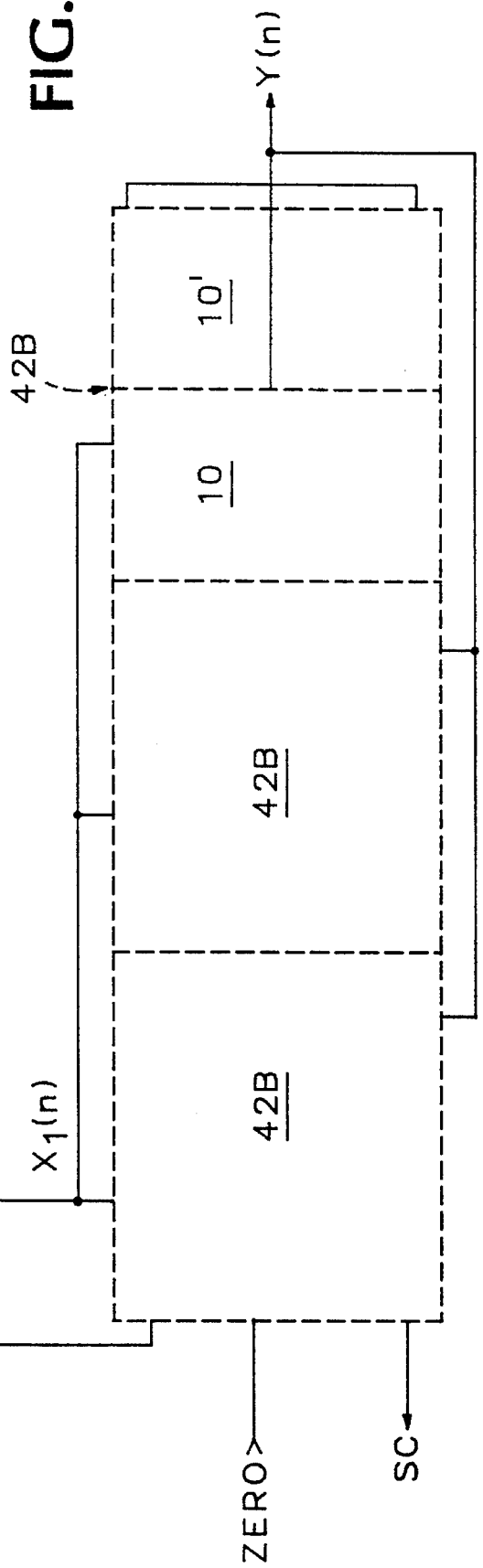
Figure 8:
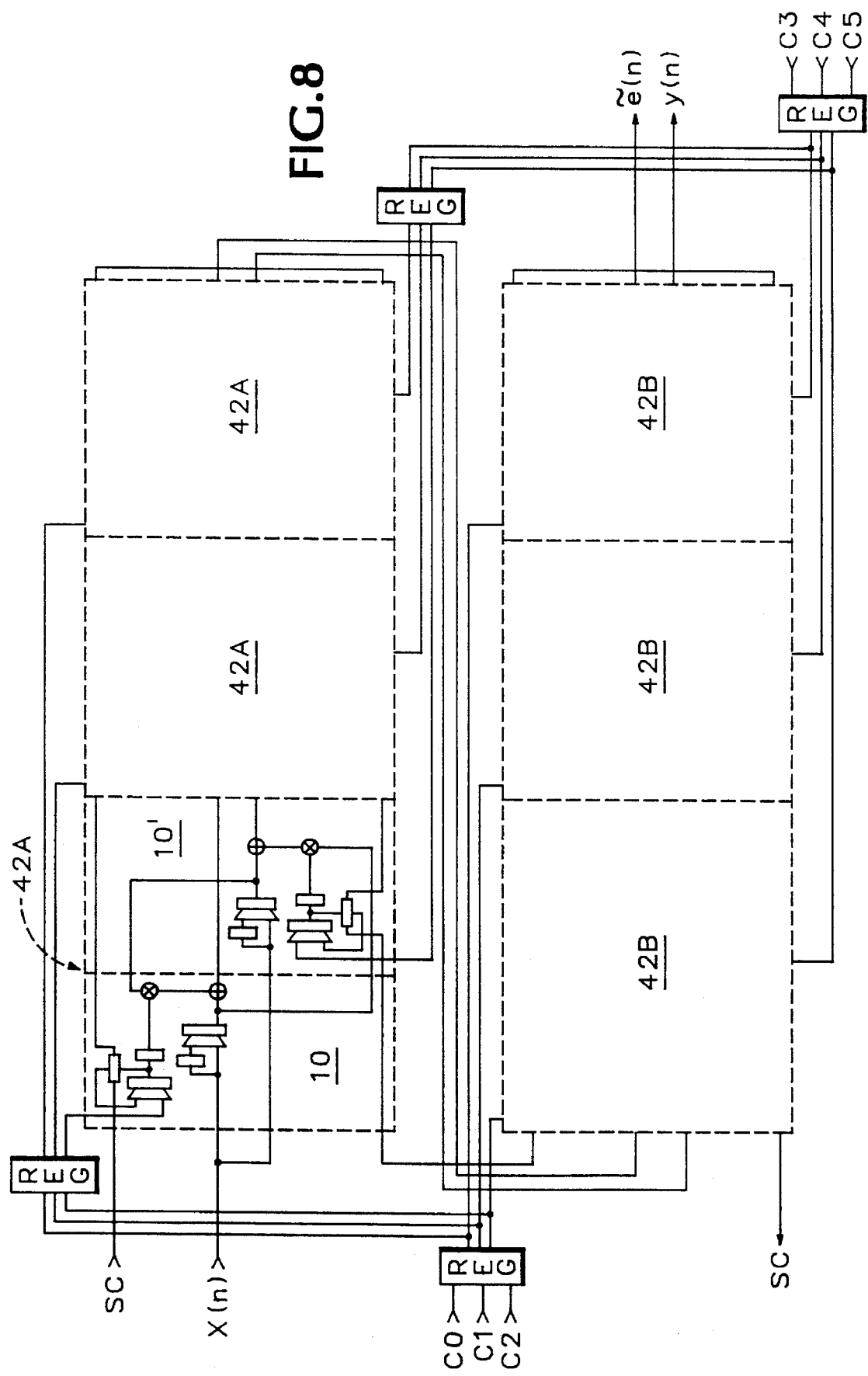
FIG. 8 is a block diagram view of a FIR lattice structure using the filter units according to the present invention.
Figure 9:
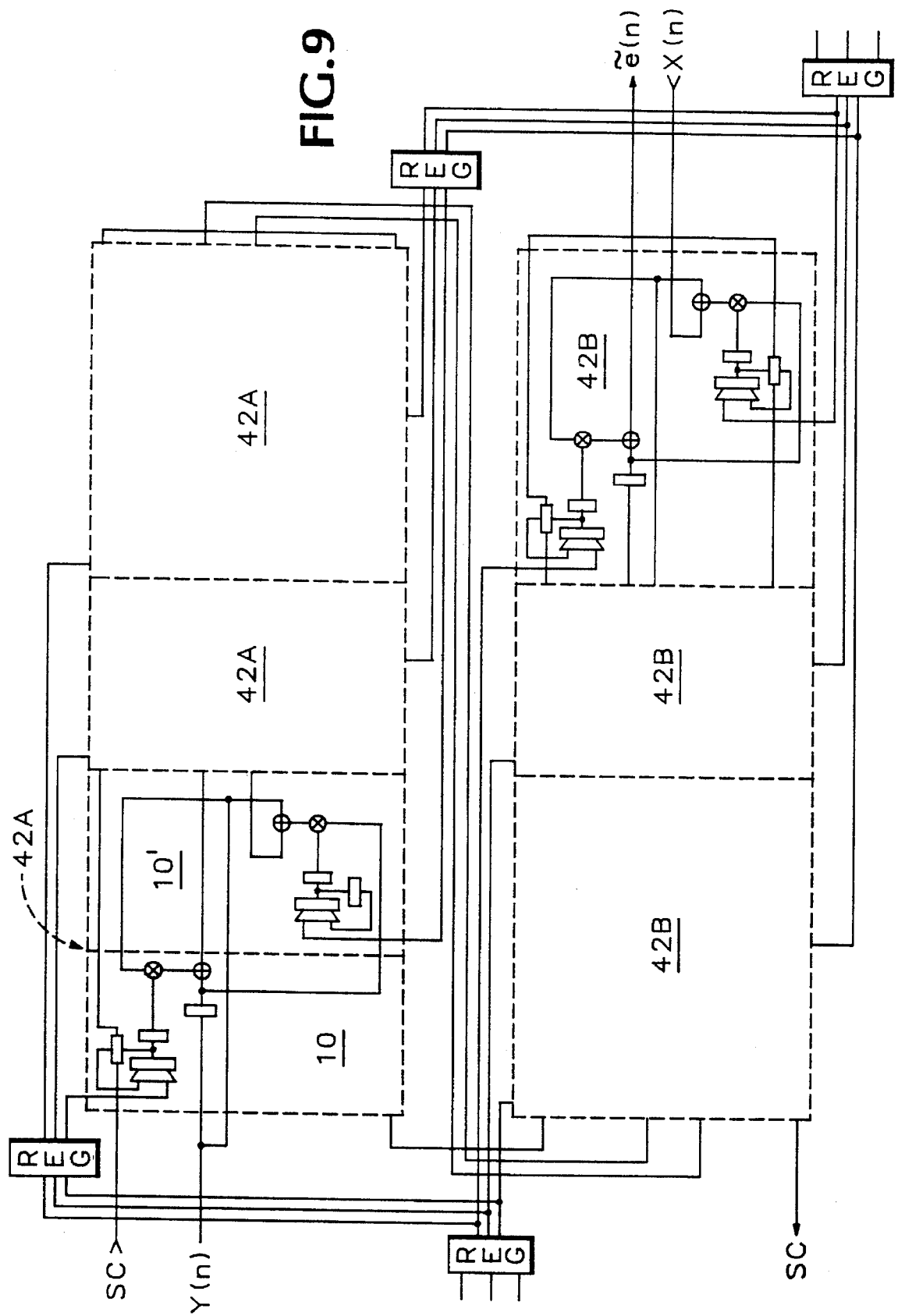
FIG. 9 is a block diagram view of a lattice form for an all pole IIR structure using the filter units according to the present invention.

FIG. 5 illustrates a transposed form of a cascade FIR structure that has a flow graph as shown in FIG. 6.29 of the Oppenheim and Schafer text book. Again with appropriate commands for the multiplexers the same basic repeatable structure is configured for the transposed cascade FIR structure. FIG. 6 illustrates a transposed IIR filter structure with a flow graph as shown in FIG. 6.26 of the Oppenheim and Schafer text book. FIG. 7 illustrates a transposed second-order cascade filter structure, corresponding to the flow graph of FIG. 6.24 in Oppenheim and Schafer. FIG. 8 illustrates a FIR lattice filter structure, corresponding to the flow graph of FIG. 6.33 of Oppenheim and Schafer. Finally FIG. 9 illustrates a lattice form for an all pole IIR filter structure, as shown in the flow graph at FIGS. 6.36 and 6.37 of Oppenheim and Schafer.

Figure 10A:
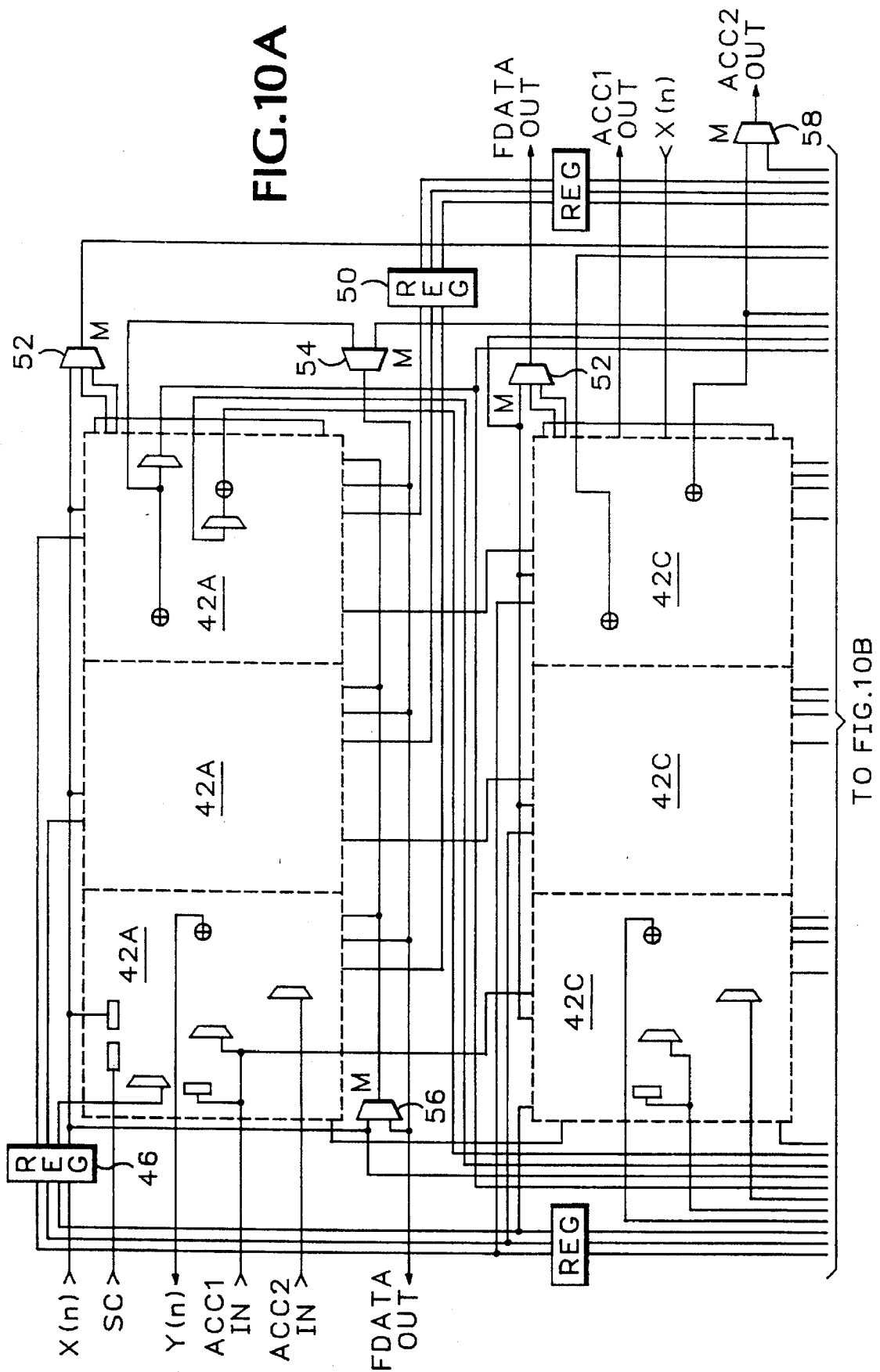
FIG. 10 is a block diagram view of an expanded programmable finite/infinite impulse response filter structure according to the present invention.
Figure 10B:
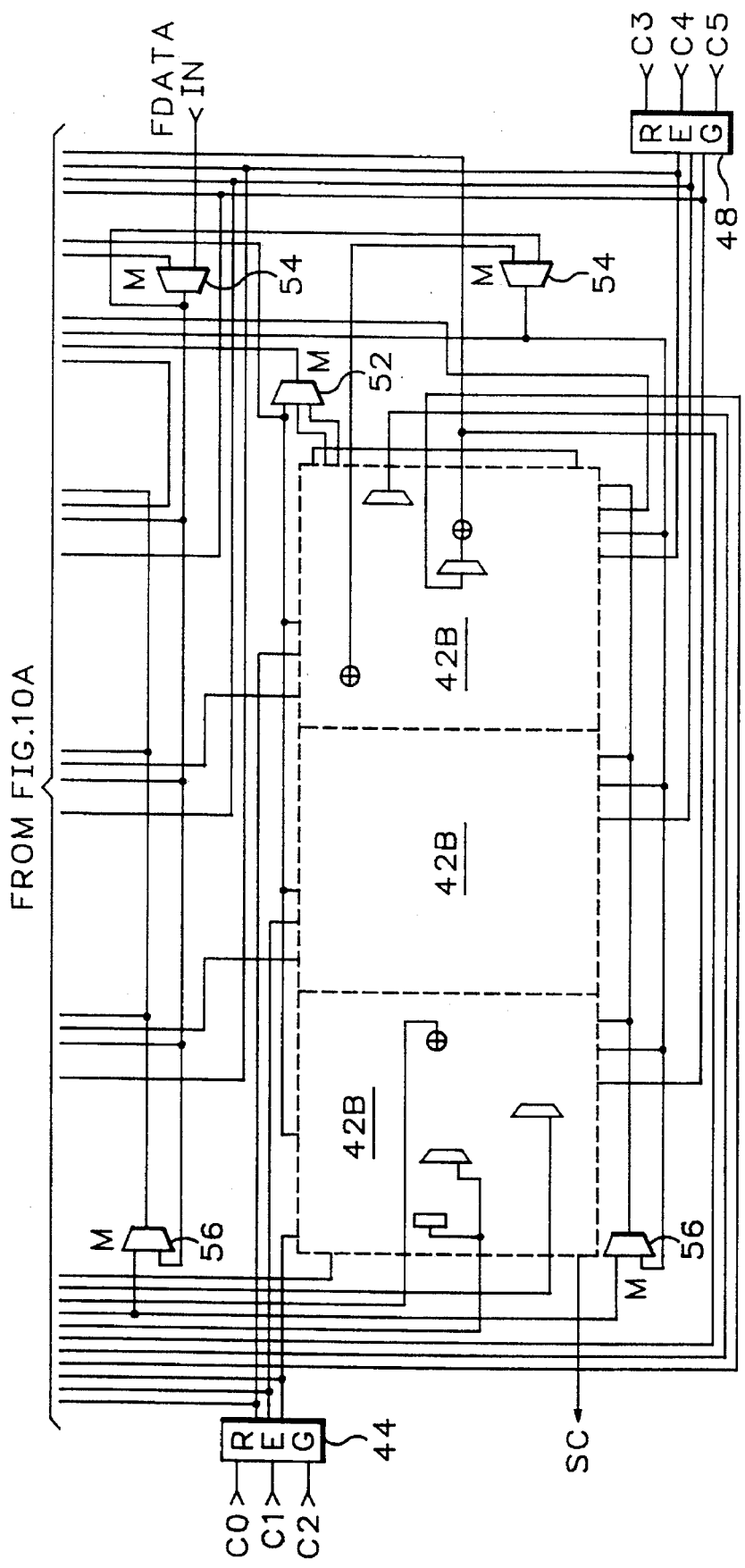
Figure 11B:
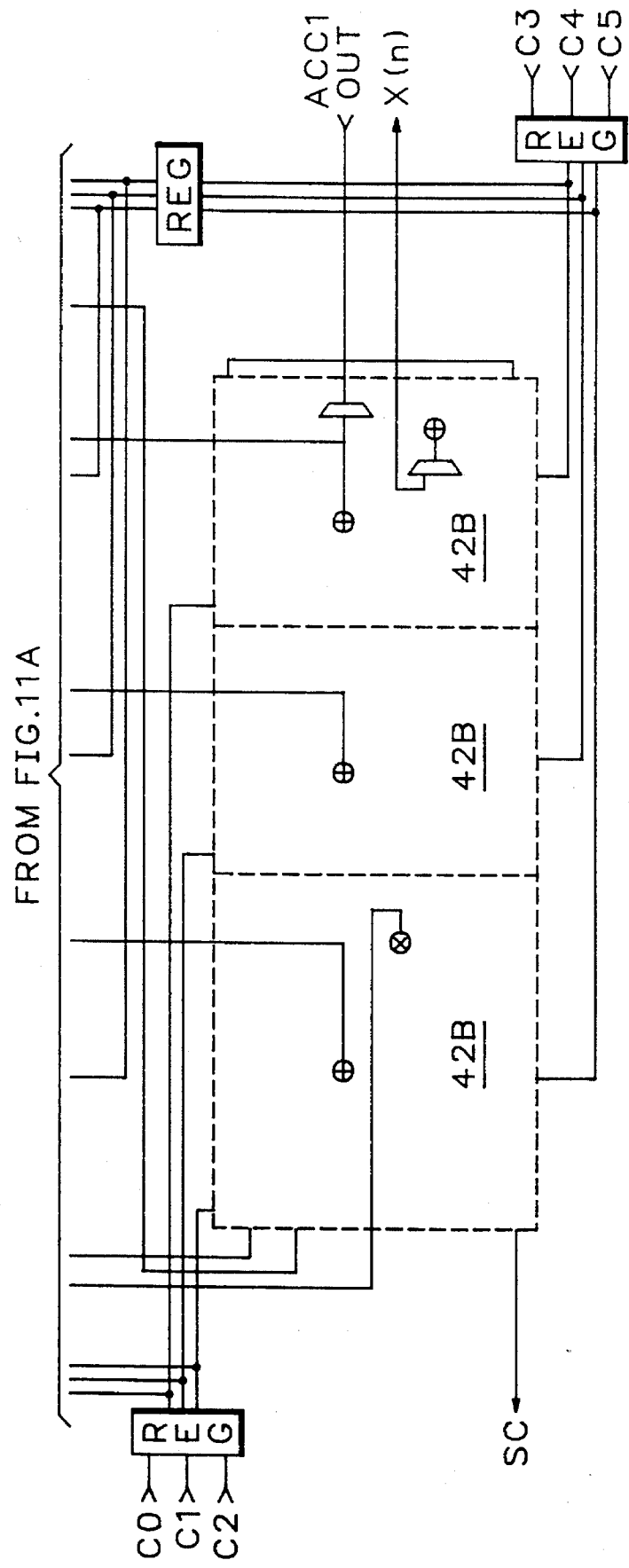
FIG. 11 is a block diagram view of a lattice form for a pole and zeros IIR structure using the filter units according to the present invention.

If, as shown in FIG. 10, the upper filter units 42A shown in FIG. 3 are stretched apart from the bottom filter units 42B, and a middle row of filter units 42C is placed between them, then two more filter structures may be realized. The middle filter units 42C are connected to the bottom filter units 42B the same way that the top filter units 42A are connected to the bottom filter units so that the middle filter units are the last filter units in the chain. Then the ACC1_IN of each cell 10 of the upper and bottom filter units 42A, 42B are connected to the LATZ inputs of each cell of the middle row filter units 42C. These connections allow implementation of the lattice structure shown in FIG. 11 with poles and zeros, as shown in FIG. 6.41 of the Oppenheim and Schafer text book. Also if a multiplexer 58 is added to the output of the middle row of filter units 42C to allow the output of the bottom row of filter units 42B to be multiplexed with the output port, then the output of multiplexer 40 of the last cell 10' of the upper row of filter units 42A is connected to the LATZ input of the last cell of the middle row of filter units. Finally the output of the last cell 10' of the middle row of filter units 42C is connected to the LATZ input of the last cell of the last row of filter units 42B. Coefficients for the multipliers 28 of the last cell 10' of the last row of filter units 42B and the first row of filter units 42A are set to a value of "1" to just add the outputs of the three rows of filter units together. This configuration allows implementation of a transposed representation of a parallel form structure for a sixth-order system with real and complex poles grouped in pairs, as shown in FIG. 12, corresponding to FIG. 6.16 of the Oppenheim and Schafer test book.

Thus the present invention provides a repeatable finite and infinite impulse response integrated circuit structure that uses programmable standard cells, pairs of which are formed into filter units. A plurality of filter units are interconnected, using appropriate external registers and multiplexers, and are programmed to form many desired FIR or IIR filter structures.

What is claimed is:

1. A repeatable filter cell comprising:

a coefficient input stage having at least two coefficient inputs for receiving respective input coefficients, a means for selecting one of the input coefficients, and a coefficient output for providing the selected coefficient as output of the coefficient input stage, a mixer stage having at least two data value inputs for receiving respective input data values, a means for selecting one of the input data values, a multiplier means for receiving the selected coefficient from the coefficient input stage and the selected input data value and multiplying the selected input data value by the selected coefficient to form a mixer stage product, and a product output for providing the mixer stage product as output of the mixer stage, an accumulator delay stage having at least one input for receiving at least one input accumulation value, a selectively variable delay means for imposing a selected delay on the input accumulation value, and an accumulation delay output for providing the selectively delayed input accumulation value as output of the accumulator delay stage, and a summation stage having an input for receiving the accumulator delay stage output, an input for receiving the mixer stage output, a means for summing the accumulation value and the mixer stage output, and a summation stage output for providing the sum of the accumulation value and the mixer stage output as output of the filter cell.

2. A filter cell according to claim 1, wherein the coefficient input stage comprises a coefficient input register having an input connected to a first of the coefficient inputs and also having an output, and a coefficient multiplexer for selecting either the output of the coefficient input register or a second of the coefficient inputs.

3. A filter cell according to claim 2, wherein the coefficient input stage further comprises a coefficient output register coupled for receiving the selected coefficient from the coefficient multiplexer and providing the selected coefficient to the coefficient output.

4. A filter cell according to claim 3, wherein the coefficient input register has a second input, and the coefficient input stage further comprises a latch means for receiving and storing the selected coefficient from the coefficient multiplexer and having an output connected both to the coefficient output register and to the second input of the coefficient input register.

5. A filter cell according to claim 2, wherein the first coefficient input is a serial input and the second coefficient input is a parallel input, the coefficient input register has a serial input connected to the first coefficient input and also has a parallel input and a parallel output, the coefficient multiplexer selects either the parallel output of the coefficient input register or the second coefficient input, and the output of the coefficient multiplexer is coupled both to the coefficient output register and to the parallel input of the coefficient input register.

6. A filter cell according to claim 1, wherein the selectively variable delay means comprises a register having an input and an output, and a multiplexer having first and second inputs and also having an output, and wherein the input of the accumulator delay stage is coupled both to the input of the register and to the first input of the multiplexer, the output of the register is coupled to the second input of the multiplexer, and the output of the multiplexer is coupled to the accumulation delay output.

7. A filter cell according to claim 1, wherein the selectively variable delay means comprises first and second registers each having an input and an output, and first and second multiplexers each having first and second inputs and also having an output, and wherein the input of the accumulator delay stage is connected to the input of the first register, the first input of the first multiplexer, and the first input of the second multiplexer, the output of the first register is connected to the second input of the first multiplexer, the output of the first multiplexer is connected to the input of the second register, the output of the second register is connected to the second input of the second multiplexer, and the output of the second multiplexer is connected to the accumulation delay output.

8. A repeatable filter cell comprising:

a first selector means having at least two data value inputs for receiving respective input data values, said first selector means selecting one of the input data values, a multiplier means having a coefficient input for receiving a coefficient and a data value input for receiving the selected input data value, said multiplier means multiplying the selected input data value by the coefficient to form a product value, a selectively variable delay means having an input for receiving a first input accumulation value, said selectively variable delay means imposing a selected delay on the first input accumulation value, a second selector means having a first input for receiving the selectively delayed first input accumulation value and a second input for receiving a second input accumulation value, said second selector means selecting the selectively delayed first input accumulation value or the second input accumulation value, and a summation means having a first input for receiving the selected accumulation value from the second selector means and a second input for receiving the product value from the multiplier means, said summation means summing the selected accumulation value and the product value and providing a filter cell output.

9. A filter unit composed of first and second filter cells each comprising:

a first selector means having at least first and second data value inputs for receiving respective input data values, said first selector means selecting one of the input data values, a multiplier means having a coefficient input for receiving a coefficient and a data value input for receiving the selected input data value, said multiplier means multiplying the selected input data value by the coefficient to form a product value, a selectively variable delay means having an input for receiving a first input accumulation value, said selectively variable delay means imposing a selected delay on the first input accumulation value, a second selector means having a first input for receiving the selectively delayed first input accumulation value and a second input for receiving a second input accumulation value, said second selector means selecting the selectively delayed first input accumulation value or the second input accumulation value, and a summation means having a first input for receiving the selected accumulation value from the second selector means and a second input for receiving the product value from the multiplier means, said summation means summing the selected accumulation value and the product value and providing a filter cell output, and wherein the output of the second selector means of the first filter cell is connected to the first input of the first selector means of the second cell, the output of the summation means of the first cell is coupled to the first input of the selectively variable delay means of the second cell, and the output of the second selector means of the second cell is connected to the first input of the first selector means of the first cell.

10. A filter unit according to claim 9, wherein the output of the summation means of the first cell is coupled to the first input of the selectively variable delay means of the second cell by a third selector means of the first cell, the third selector means of the first cell having a first input connected to the output of the summation means of the first cell, a second input, and an output, the third selector means selecting its first or second input, and wherein the output of the third selector means of the first cell is connected to the input of the selectively variable delay means of the second cell.

11. A filter unit according to claim 10, wherein the second cell also comprises a third selector means, the third selector means of the second cell having a first input connected to the output of the summation means of the second cell, a second input connected to the output of the summation means of the first cell, and an output that is connected to a secondary output of the second cell, the third selector means selecting its first or second input.

12. A filter unit according to claim 9, wherein the output of the summation means of the first cell is coupled both to the input of the selectively variable delay means of the second cell and to the second input of the second selector means of the second cell, whereby the second input accumulation value received by the second selector means of the second cell is the same as the first input accumulation value that is applied to the selectively variable delay means of the second cell.

13. A filter unit according to claim 9, wherein the first cell has an accumulation input that is connected to the input of the selectively variable delay means of the first cell and to the second input of the second selector means of the first cell, whereby the second input accumulation value received by the second selector means of the first cell is the same as the first input accumulation value that is applied to the selectively variable delay means of the first cell.

14. A filter unit composed of first and second filter cells each comprising:

a coefficient input stage having at least one coefficient input for receiving an input coefficient, and a coefficient output for providing the input coefficient as output of the coefficient input stage, a mixer stage having at least one data value input for receiving an input data value, a means for receiving the coefficient from the coefficient input stage and the input data value and multiplying the input data value by the coefficient to form a mixer stage product, and a product output for providing the mixer stage product as output of the mixer stage, an accumulator delay stage for receiving at least one input accumulation value, a selectively variable delay means for imposing a selected delay on the input accumulation value, and an accumulation output for providing the selectively delayed input accumulation value as output of the accumulator delay stage, and a summation stage having an input for receiving the accumulator delay stage output, an input for receiving the mixer stage output, a means for summing the accumulation value and the product value, and a summation stage output for providing the sum of the accumulation value and the mixer stage output as output of the filter cell, and wherein the output of the accumulator delay stage of the second cell is provided as one input to the mixer stage of the first cell and the output of the accumulator delay stage of the first cell is provided as one input to the mixer stage of the second cell.

15. A filter unit according to claim 14, wherein the mixer stage of each filter cell comprises a selector means for selecting either said one input or a second input.

16. A programmable filter module comprising:

a first filter unit that comprises at least a first multiplier means having a data value input for receiving an input data value and a coefficient input for receiving a coefficient, said first multiplier means multiplying the input data value by the coefficient to form a first product value, and a first summation means for receiving the first product value and a first input accumulation value and providing a first output accumulation value at a first accumulation output of the first filter unit, a second filter unit having at least a first accumulation input connected to the first accumulation output of the first filter unit, a feedback accumulation input, and an accumulation output, the second filter unit being composed of first and second filter cells each comprising:

a coefficient input stage having at least one coefficient input for receiving an input coefficient, and a coefficient output for providing the input coefficient as output of the coefficient input stage, a mixer stage having at least one data value input for receiving an input data value, a means for receiving the coefficient from the coefficient input stage and the input data value and multiplying the input data value by the coefficient to form a mixer stage product, and a product output for providing the mixer stage product as output of the mixer stage, an accumulator delay stage for receiving at least first and second input accumulation values, a selectively variable delay means for imposing a selected delay on the first input accumulation value, and a selector means for selecting either the selectively delayed first input accumulation value or the second input accumulation value as output of the accumulator delay stage, and a summation stage having an input for receiving the accumulator delay stage output, an input for receiving the mixer stage output, a means for summing the selected accumulation value and the product value, and a summation stage output for providing the sum of the selected accumulation value and the mixer stage output as output of the filter cell, and wherein the first accumulation input of the second filter unit is connected to provide the first input accumulation value of the first cell, the output of the accumulator delay stage of the second cell is provided as one input to the mixer stage of the first cell, the output of the accumulator delay stage of the first cell is provided as one input to the mixer stage of the second cell, and the feedback accumulation input is connected to provide the second input accumulation value of the second cell, and a third filter unit having at least a first accumulation input connected to the accumulation output of the second filter unit, a feedback accumulation output connected to the feedback accumulation input of the second filter unit, and at least a first accumulation output.

17. A programmable filter module according to claim 16, wherein the first filter unit has at least a first accumulation input, a feedback accumulation input, and an accumulation output, and is composed of first and second filter cells each comprising:

a coefficient input stage having at least one coefficient input for receiving an input coefficient, and a coefficient output for providing the input coefficient as output of the coefficient input stage, a mixer stage having at least one data value input for receiving an input data value, a means for receiving the coefficient from the coefficient input stage and the input data value and multiplying the input data value by the coefficient to form a mixer stage product, and a product output for providing the mixer stage product as output of the mixer stage, an accumulator delay stage for receiving at least first and second input accumulation values, a selectively variable delay means for imposing a selected delay on the first input accumulation value, and a selector means for selecting either the selectively delayed first input accumulation value or the second input accumulation value as output of the accumulator delay stage, and a summation stage having an input for receiving the accumulator delay stage output, an input for receiving the mixer stage output, a means for summing the selected accumulation value and the product value, and a summation stage output for providing the sum of the selected accumulation value and the mixer stage output as output of the filter cell, and wherein the first accumulation input of the first filter unit is connected to provide the first input accumulation value of the first cell, the output of the accumulator delay stage of the second cell is provided as one input to the mixer stage of the first cell, the output of the accumulator delay stage of the first cell is provided as one input to the mixer stage of the second cell, and the feedback accumulation input is connected to provide the second input accumulation value of the second cell.

18. A programmable filter module according to claim 17, wherein the summation stage output of the second cell of the second filter unit is connected to the feedback accumulation input of the first filter unit.

19. A programmable filter module according to claim 16, wherein the third filter unit has at least a first accumulation input, a feedback accumulation input, and an accumulation output, and is composed of first and second filter cells each comprising:

a coefficient input stage having at least one coefficient input for receiving an input coefficient, and a coefficient output for providing the input coefficient as output of the coefficient input stage, a mixer stage having at least one data value input for receiving an input data value, a means for receiving the coefficient from the coefficient input stage and the input data value and multiplying the input data value by the coefficient to form a mixer stage product, and a product output for providing the mixer stage product as output of the mixer stage, an accumulator delay stage for receiving at least first and second input accumulation values, a selectively variable delay means for imposing a selected delay on the first input accumulation value, and a selector means for selecting either the selectively delayed first input accumulation value or the second input accumulation value as output of the accumulator delay stage, and a summation stage having an input for receiving the accumulator delay stage output, an input for receiving the mixer stage output, a means for summing the selected accumulation value and the product value, and a summation stage output for providing the sum of the selected accumulation value and the mixer stage output as output of the filter cell, and wherein the first accumulation input of the third filter unit is connected to provide the first input accumulation value of the first cell, the output of the accumulator delay stage of the second cell is provided as one input to the mixer stage of the first cell, the output of the accumulator delay stage of the first cell is provided as one input to the mixer stage of the second cell, and the feedback accumulation input is connected to provide the second input accumulation value of the second cell.

20. A programmable filter module according to claim 19, wherein the summation stage output of the second cell of the third filter unit is connected to the feedback accumulation input of the second filter unit.

21. A programmable filter module according to claim 16, wherein the first and third filter units are each composed of first and second filter cells each comprising a coefficient input stage, a mixer stage, and a summation stage, and wherein the coefficient input stage of each filter cell has at least one serial coefficient input connected to a coefficient register for receiving an input coefficient in serial form, and each coefficient register has a serial output, and wherein the coefficient register of at least one filter cell of the second filter unit is connected in series between a coefficient register of a filter cell of the first filter unit and a coefficient register of a filter cell of the third filter unit.

22. A programmable filter module according to claim 21, wherein the coefficient register of the first filter cell of the second filter unit is connected in series between the coefficient register of the first filter filter cell of the first filter unit and the coefficient register of the first filter cell of the third filter unit, and the coefficient register of the second filter cell of the second filter unit is connected in series between the coefficient register of the second filter filter cell of the first filter unit and the coefficient register of the second filter cell of the third filter unit.

23. A programmable filter unit according to claim 16, wherein the second filter unit has a second accumulation input connected to provide the second accumulation input value of the first cell, and the first filter unit further comprises a second multiplier means having a data value input for receiving a second input data value and a coefficient input for receiving a second coefficient, said second multiplier means multiplying the second input data value by the second coefficient to form a second product value, and a second summation means for receiving the second product value and a second input accumulation value and providing a second output accumulation value at a second accumulation output of the first filter unit, and the second accumulation output of the first filter unit is connected to the second accumulation input of the second filter unit.

* * * * *